US010283151B1

(12) United States Patent
Wessel et al.

(10) Patent No.: US 10,283,151 B1
(45) Date of Patent: May 7, 2019

(54) LASER DIODE WITH INTEGRATED TEMPERATURE CONTROL UNIT FOR A HEAT-ASSISTED MAGNETIC RECORDING DEVICE

(71) Applicant: Seagate Technology LLC, Cupertino, CA (US)

(72) Inventors: James Gary Wessel, Savage, MN (US); Scott Eugene Olson, Eagan, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/933,721

(22) Filed: Mar. 23, 2018

Related U.S. Application Data

(60) Provisional application No. 62/500,073, filed on May 2, 2017.

(51) Int. Cl.

| | |
|---|---|
| ***G11B 5/31*** | (2006.01) |
| ***G11B 5/48*** | (2006.01) |
| ***H01S 5/042*** | (2006.01) |
| ***H01S 5/026*** | (2006.01) |
| ***H01S 5/024*** | (2006.01) |
| *G11B 5/00* | (2006.01) |

(52) U.S. Cl.
CPC ............ *G11B 5/4866* (2013.01); *H01S 5/026* (2013.01); *H01S 5/02407* (2013.01); *H01S 5/02453* (2013.01); *H01S 5/0425* (2013.01); *G11B 2005/0021* (2013.01)

(58) Field of Classification Search
None
See application file for complete search history.

(56) References Cited

U.S. PATENT DOCUMENTS

| | | | | |
|---|---|---|---|---|
| 4,737,798 | A | 4/1988 | Lonis et al. | |
| 4,916,465 | A | 4/1990 | Van Tongeren et al. | |
| 5,140,605 | A | 8/1992 | Paoli et al. | |
| 5,488,625 | A | 1/1996 | Nakamori et al. | |
| 8,705,323 | B2 * | 4/2014 | Contreras | G11B 13/04 360/59 |
| 8,854,930 | B1 | 10/2014 | Clinton et al. | |
| 9,013,967 | B1 * | 4/2015 | Nakamura | G11B 11/10532 369/13.32 |
| 9,074,941 | B1 * | 7/2015 | Krichevsky | G01K 7/01 |
| 9,135,937 | B1 * | 9/2015 | Goulakov | H01S 5/062 |
| 9,281,659 | B1 | 3/2016 | Tatah et al. | |
| 9,418,691 | B2 * | 8/2016 | Peng | G11B 5/314 |
| 9,431,043 | B2 * | 8/2016 | Boone, Jr. | G11B 5/6088 |
| 2006/0039427 | A1 | 2/2006 | Charles | |

(Continued)

*Primary Examiner* — William J Klimowicz
(74) *Attorney, Agent, or Firm* — Hollingsworth Davis, LLC

(57) ABSTRACT

An apparatus comprises a first electrical contact, a second electrical contact, and a semiconductor device disposed between the first and second electrical contacts. The semiconductor device comprises a laser diode and a temperature control unit. The laser diode comprises p-type semiconductor material and n-type semiconductor material. The temperature control unit comprises p-type semiconductor material, n-type semiconductor material, and a resistor coupled to the laser diode. One of the p-type semiconductor material and the n-type semiconductor material is shared by the laser diode and the temperature control unit.

20 Claims, 11 Drawing Sheets

(56) References Cited

U.S. PATENT DOCUMENTS

| | | | |
|---|---|---|---|
| 2008/0063016 | A1 | 3/2008 | Bhatia et al. |
| 2015/0340053 | A1 | 11/2015 | Peng et al. |
| 2016/0087401 | A1 | 3/2016 | Wessel et al. |
| 2016/0087402 | A1 | 3/2016 | Tatah et al. |
| 2016/0189741 | A1 | 6/2016 | Tatah et al. |

* cited by examiner 400
402
404
410
418
416
$V_a$
$V_b$
Resistor/Shunt
Temperature Control Unit 414
Laser Diode 412
Shared N- or P-Type Semiconductor Material 600
602
Laser on
604
Laser off
606
608
610
612
Laser on
614
With heater
Without heater
ΔT1
ΔT2
+
0
-
Laser Bias (V) [=Va - Vb]
Temp (C)
time

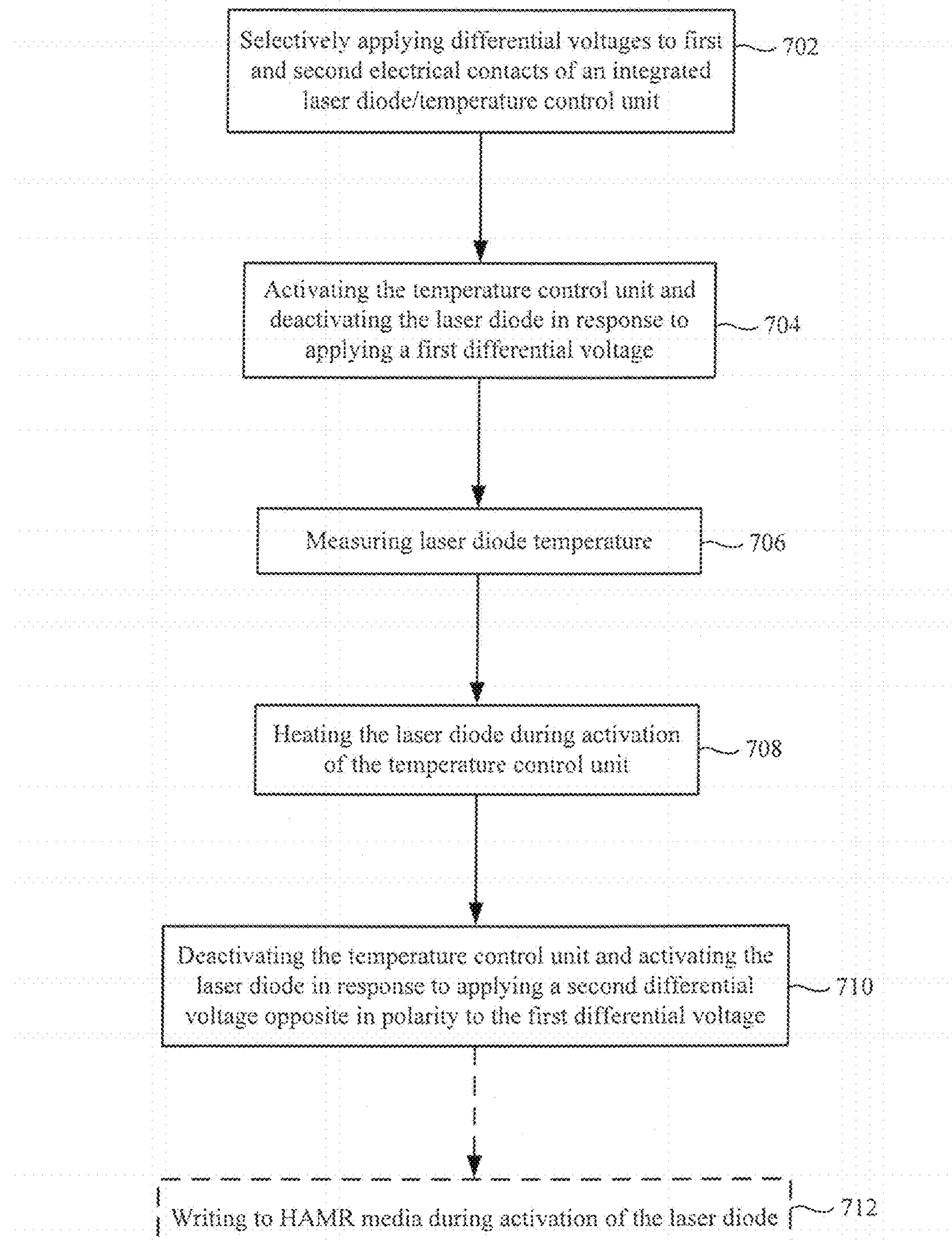
FIGURE 7
Selectively applying differential voltages to first and second electrical contacts of an integrated laser diode/temperature control unit
702
Activating the temperature control unit and deactivating the laser diode in response to applying a first differential voltage
704
Measuring laser diode temperature
706
Heating the laser diode during activation of the temperature control unit
708
Deactivating the temperature control unit and activating the laser diode in response to applying a second differential voltage opposite in polarity to the first differential voltage
710
Writing to HAMR media during activation of the laser diode
712

800
810
850
870a
870b
870
872
858
854
860
856
862
804
802
814
815
816
817
812
812
N
P
P
N
ACTIVE
ACTIVE
$V_a$
$V_b$ 1100
1110
1150
$V_b$
$V_a$
N
active
insulators
Undoped (electrically insulating)
P
P
1102
1104
1106
1112
1112a
1112b
1112c
1112d
1113
1113a
1113b
1114
1115
1116
1118
1154
1156
1158
1160
1170
1170a
1170b

LASER DIODE WITH INTEGRATED TEMPERATURE CONTROL UNIT FOR A HEAT-ASSISTED MAGNETIC RECORDING DEVICE

RELATED APPLICATIONS

This application claims the benefit of Provisional Patent Application Ser. No. 62/500,073 filed on May 2, 2017 and which is hereby incorporated herein by reference in its entirety.

SUMMARY

Embodiments are directed to an apparatus comprising a first electrical contact, a second electrical contact, and a semiconductor device disposed between the first and second electrical contacts. The semiconductor device comprises a laser diode and a temperature control unit. The laser diode comprises p-type semiconductor material and n-type semiconductor material. The temperature control unit comprises p-type semiconductor material, n-type semiconductor material, and a resistor or a shunt coupled to the laser diode. One of the p-type semiconductor material and the n-type semiconductor material is shared by the laser diode and the temperature control unit.

Embodiments are directed to an apparatus comprising a slider configured for heat-assisted magnetic recording. The slider comprises a writer, a near-field transducer, and an optical waveguide configured to communicate light through the slider. A semiconductor device is integral or coupled to the slider. The semiconductor device is disposed between a first electrical contact and a second electrical contact. The semiconductor device comprises a laser diode coupled to the waveguide and comprising p-type semiconductor material and n-type semiconductor material. The semiconductor device also comprises a temperature control unit comprising p-type semiconductor material, n-type semiconductor material, and a resistor or a shunt coupled to the laser diode. One of the p-type and n-type semiconductor materials is shared by the laser diode and the temperature control unit.

The above summary is not intended to describe each disclosed embodiment or every implementation of the present disclosure. The figures and the detailed description below more particularly exemplify illustrative embodiments.

BRIEF DESCRIPTION OF THE DRAWINGS

FIG. 7 is a flow chart that characterizes the general operation of the integrated semiconductor device shown in FIG. 4 and other figures in accordance with various embodiments;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure generally relates to heat-assisted magnetic recording (HAMR), also referred to as energy-assisted magnetic recording (EAMR), thermally-assisted magnetic recording (TAMR), and thermally-assisted recording (TAR). This technology uses a laser source and a near-field transducer (NFT) to heat a small spot on a magnetic disk during recording. The heat lowers magnetic coercivity at the spot, allowing a write transducer to change the orientation of a magnetic domain at the spot. Due to the relatively high coercivity of the medium after cooling, the data is less susceptible to superparamagnetic effects that can lead to data errors.

Figure 1:
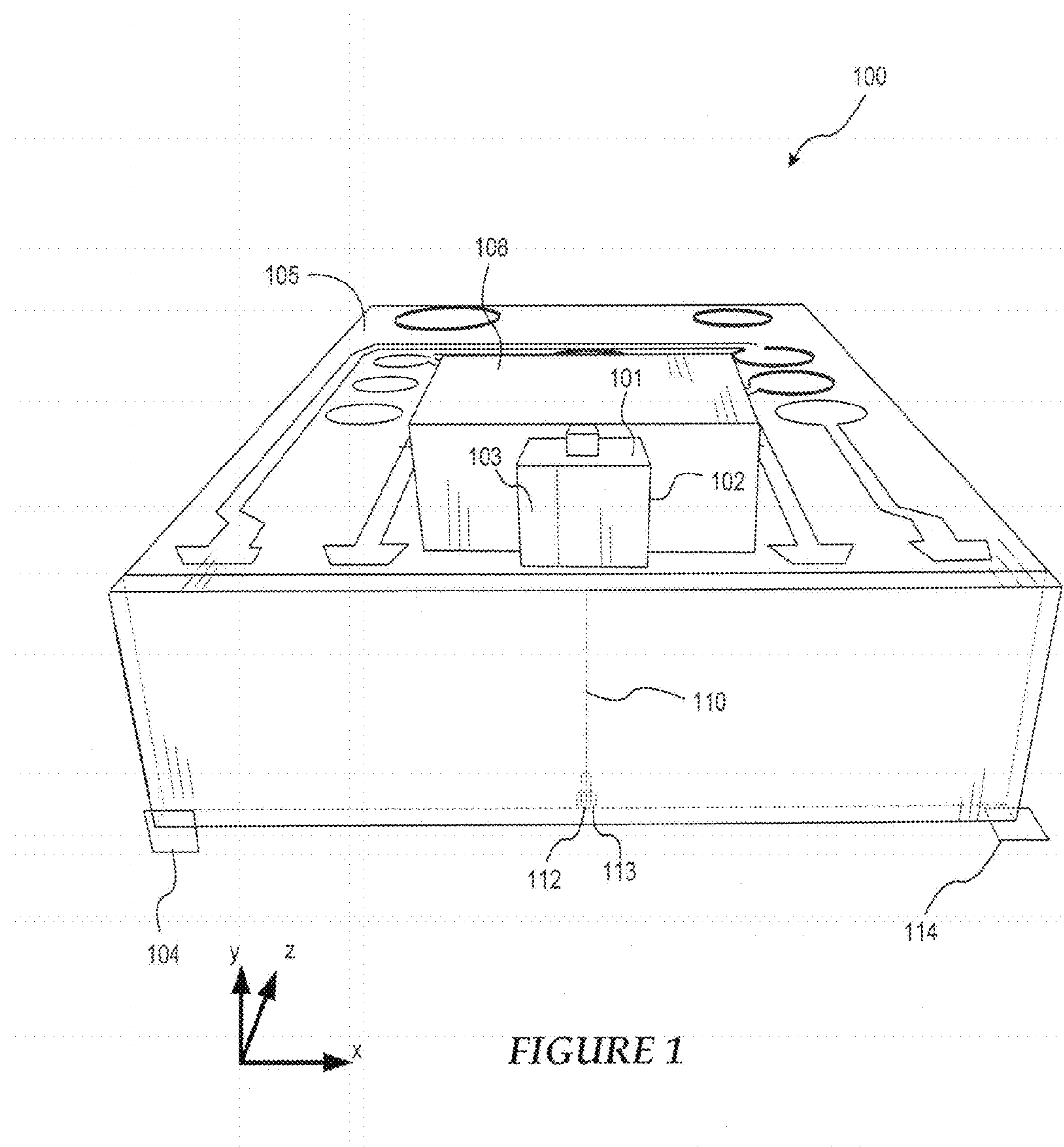
FIG. 1 is a perspective view of a HAMR slider with which various embodiments disclosed herein may be implemented.
Figure 2:
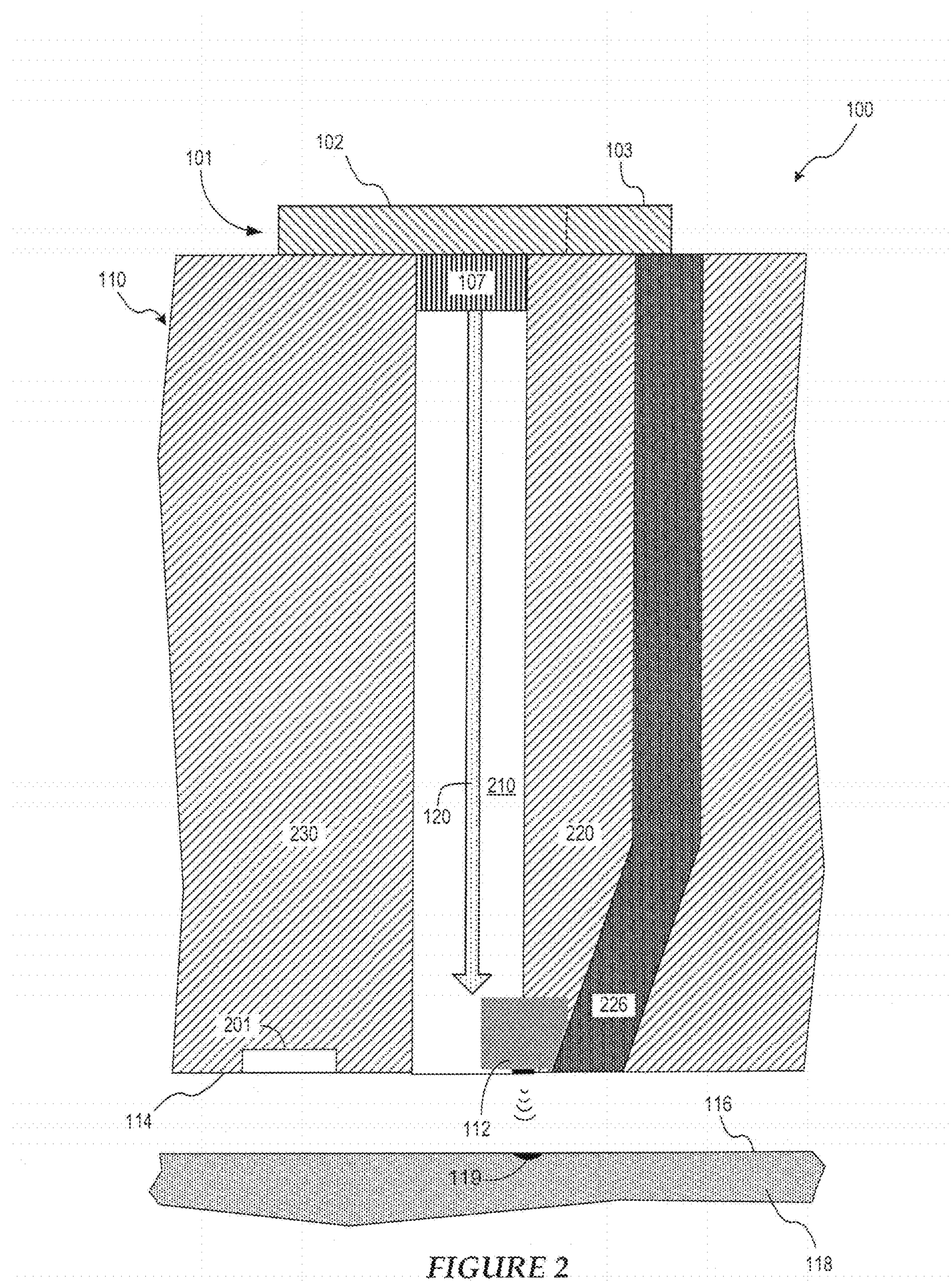
FIG. 2 is a cross-sectional view of a HAMR slider with which various embodiments disclosed herein may be implemented.

Embodiments of a HAMR slider 100 are illustrated in FIGS. 1 and 2. As shown, the head 100 (also referred to as a slider) includes a light source (e.g., a laser diode) 102 located proximate a trailing edge surface 104 of the slider body 105. An optical wave (e.g., a laser beam) generated by the light source 102 is delivered to an NFT 112 via an optical waveguide 110. The NFT 112 is aligned with a plane of an air bearing surface (ABS) 114 of the head 100, and one edge of a read/write head 113 is on the ABS 114. The read/write head 113 includes at least one writer and at least one reader. In some embodiments, multiple writers (e.g., 2 writers) and multiple readers (e.g., 3 readers) can be incorporated into the read/write head 113. The ABS 114 faces, and is held proximate to, a surface 116 of a magnetic medium 118 during device operation. The ABS 114 is also referred to as a media-facing surface. The laser diode 102 in this representative example may be an integral, edge emitting device, although it will be appreciated that any source of electromagnetic energy may be used. For example, a surface emitting laser (SEL), instead of an edge emitting laser, may be used as the laser source 102. A laser source 102 may also be mounted alternatively to other surfaces of the head 100, such as the trailing edge surface 104.

According to various embodiments, the laser diode 102 is a component of an integrated semiconductor device 101 that includes the laser diode 102 and a temperature control unit (TCU) 103. The integrated laser diode 102 and TCU 103 are typically fabricated as a unitary semiconductor device using conventional semiconductor fabrication techniques. The TCU 103 is configured to heat (e.g., preheat) the laser diode 102 during times when the laser diode 102 is not lasing, such as during a write operation. As will be discussed below, preheating the laser diode 102 via the TCU 103 improves the stability of output optical power of the laser diode 102.

In some embodiments, the integrated semiconductor device 101 can be built into the slider 100 itself. For example, the laser diode 102 and TCU 103 can be fabricated directly as part of the slider 100 itself. As another example, the integrated semiconductor device 101 can be a separate component that is directly embedded inside the slider 100, rather than on top or alongside of the slider 100 as is shown in the embodiments illustrated in FIGS. 1 and 2. While the representative embodiments of FIGS. 1 and 2 show the waveguide 110 integrated with the head 100, any type of light delivery configuration may be used. As shown in FIG. 1, the integrated semiconductor device 101 is shown coupled to the slider body 105 via a submount 108. The submount 108 can be used to orient and affix an edge-emitting laser diode 102 so that its output is directed downwards (negative y-direction in the figure). An input surface of the slider body 105 may include a grating, an optical coupler, or other coupling features to receive light from the laser diode 102.

When writing with a HAMR device, electromagnetic energy is concentrated onto a small hotspot 119 over the track of the magnetic medium 118 where writing takes place, as is shown in the embodiment of FIG. 2. The light from the laser diode 102 propagates to the NFT 112, e.g., either directly from the laser diode 102 or through a mode converter or by way of a focusing element. FIG. 2, for example, shows an optical coupler 107 adjacent the laser diode 102, which is configured to couple light produced from the laser diode to the waveguide 110.

As a result of what is known as the diffraction limit, optical components cannot be used to focus light to a dimension that is less than about half the wavelength of the light. The lasers used in some HAMR designs produce light with wavelengths on the order of 700-1550 nm, yet the desired hot spot 119 is on the order of 50 nm or less. Thus, the desired hot spot size is well below half the wavelength of the light. Optical focusers cannot be used to obtain the desired hot spot size, being diffraction limited at this scale. As a result, the NFT 112 is employed to create a hotspot on the media.

The NFT 112 is a near-field optics device configured to generate local surface plasmon resonance at a designated (e.g., design) wavelength. The NFT 112 is generally formed from a thin film of plasmonic material on a substrate. In a HAMR slider 100, the NFT 112 is positioned proximate the write pole 226 of the read/write head 113. The NFT 112 is aligned with the plane of the ABS 114 parallel to the surface 116 of the magnetic medium 118. The waveguide 110 and optional mode converter 107 and/or other optical element directs electromagnetic energy 120 (e.g., laser light) onto the NFT 112. The NFT 112 achieves surface plasmon resonance in response to the incident electromagnetic energy 120. The plasmons generated by this resonance are emitted from the NFT 112 towards the magnetic medium 118 where they are absorbed to create a hotspot 119. At resonance, a high electric field surrounds the NFT 112 due to the collective oscillations of electrons at the metal surface (e.g., substrate) of the magnetic medium 118. At least a portion of the electric field surrounding the NFT 112 gets absorbed by the magnetic medium 118, thereby raising the temperature of a spot 119 on the medium 118 as data is being recorded.

FIG. 2 shows a detailed partial cross-sectional view of an embodiment of the HAMR slider 100 in accordance with various embodiments. The waveguide 110 includes a layer of core material 210 surrounded by first and second cladding layers 220 and 230. The first cladding layer 220 is shown proximate the NFT 112 and the write pole 226. The second cladding layer 230 is spaced away from the first cladding layer 220 and separated therefrom by the waveguide core 210. The core layer 210 and cladding layers 220 and 230 may be fabricated from dielectric materials, such as optical grade amorphous material with low thermal conductivities. The first and second cladding layers 220 and 230 may each be made of the same or a different material. The materials are selected so that the refractive index of the core layer 210 is higher than refractive indices of the cladding layers 220 and 230. This arrangement of materials facilitates efficient propagation of light through the waveguide core 210. Optical focusing elements (not shown) such as mirrors, lenses, etc., may be utilized to concentrate light onto the NFT 112. These and other components may be built on a common substrate using wafer manufacturing techniques known in the art. The waveguide 110 may be configured as a planar waveguide or channel waveguide.

According to some embodiments, the head 100 includes one or more sensors, such as the sensor 201 shown in FIG. 2. In some embodiments, the sensor 201 can be a contact sensor configured to sense for one or more of head-medium contact, thermal asperities, and voids of a magnetic recording medium. In other embodiments, the sensor 201 can be a bolometer or a combined contact sensor/bolometer. The sensor 201 can be configured to produce a response to laser light that is used to detect laser diode instability, such as mode hops, in accordance with various embodiments. The sensor 201 can be a resistive sensor that can be implemented as a thermal sensor, such as a resistive temperature sensor (e.g., TCR sensor). For example, the sensor 201 can be implemented as a DETCR (Dual Ended Thermal Coefficient of Resistance) sensor. The sensor 201 can alternatively be implemented as a ground-split TCR sensor, where one contact of the sensor 201 is coupled to a bias source and the other contact is coupled to ground. The sensor 201 can be a thermo-resistive/electric sensor or a piezoresistive/electrical sensor, for example. By way of further example, the sensor 201 can be a thermocouple or a thermistor. The sensor 201 can be situated at or near the ABS 114 and proximate the NFT 112. As such, the sensor 201 can also serve as a temperature sensor for the NFT 112 and as a head-medium/asperity contact sensor.

The output of a laser diode used in a HAMR drive is temperature sensitive and susceptible to self-heating. During write operation, for example, laser diode heating can vary the junction temperature of the laser diode, causing a shift in laser emission wavelength, leading to a change of optical feedback from the optical path in the slider to the cavity of the laser diode, a phenomenon that is known to lead to mode hopping and/or power instability of the laser diode. Mode hopping is particularly problematic in the context of lasers emitting primarily a single frequency. Under some external influences, such a laser may operate on one resonator mode (e.g., produce energy with a first wavelength) for some time, but then suddenly switch to another mode (produce energy, often with different magnitude, with a second wavelength) performing "mode hopping." Temperature variation is known to cause mode hopping in laser diodes. Mode hopping is problematic for HAMR applications, as mode hopping leads to laser output power jumping and magnetic transition shifting from one data bit location (e.g., one block of data) to another. It is noted that the laser output power can jump in either direction (higher or lower) with a mode hop and that a jump in either direction is undesirable. Large transition shifts in a data bit location due to a mode hop may not be recoverable by channel decoding, resulting in error bits. Preheating of the laser diode 102 by the TCU 103 prior to a write operation reduces temperature fluctuations at the laser diode junction, which serves to reduce the likelihood of mode hopping.

Figure 3:
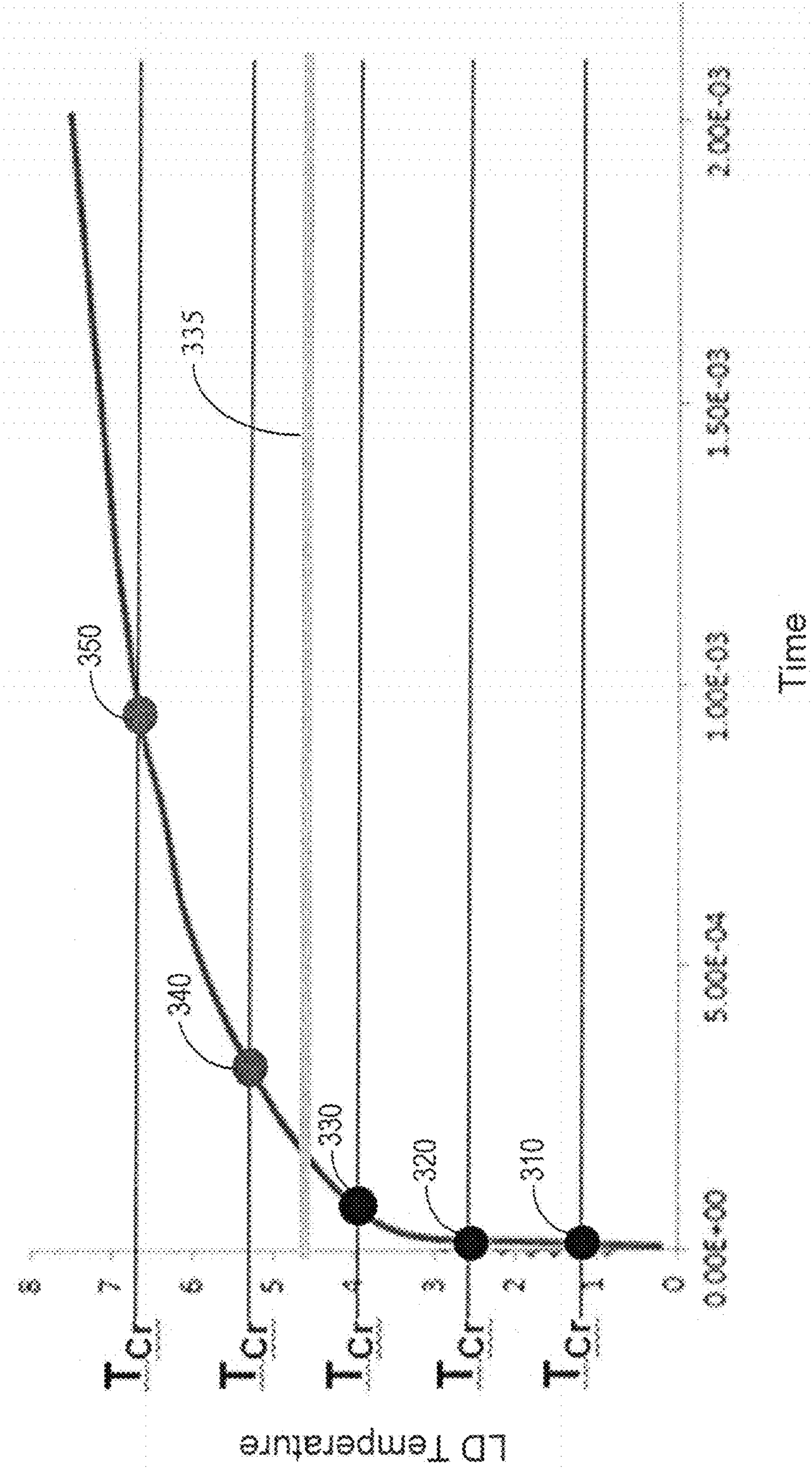
FIG. 3 shows a temperature versus time graph for a laser diode.

According to various implementations, when the laser diode 102 heats up in response to a write request, instabilities in the system may arise. These instabilities may occur at specific critical temperatures ($T_{Cr}$). These critical temperatures may be different for every laser diode and/or may depend of various factors such as the current environment, for example. FIG. 3 shows the temperature versus time for a laser diode. In this example, there are five critical temperatures 310, 320, 330, 340, 350. When heating up a laser diode, the temperature rises quickly at first and then starts to level off. The critical temperatures are substantially periodic. Thus, more critical temperatures are experienced in a short period of time at the beginning of the heat-up process because the system is heating up more quickly than at later times. Therefore, it can be observed that the higher the slope of the temperature rise in time, the higher the probability of reaching a higher number of critical temperatures. If the system can start preheating the laser diode to a temperature before the write process starts, the number of possible transitions though critical temperatures is reduced. If a preheat takes place and the system is heated to temperature 335 shown in FIG. 3, for example, the first three critical temperatures 310, 320, 330 are reached before the write operation starts and only two critical temperatures 340, 350 are experienced during the write operation. A system without a laser diode preheat feature would experience all five 310, 320, 330, 340, 350 critical temperatures in this example.

Figure 4:
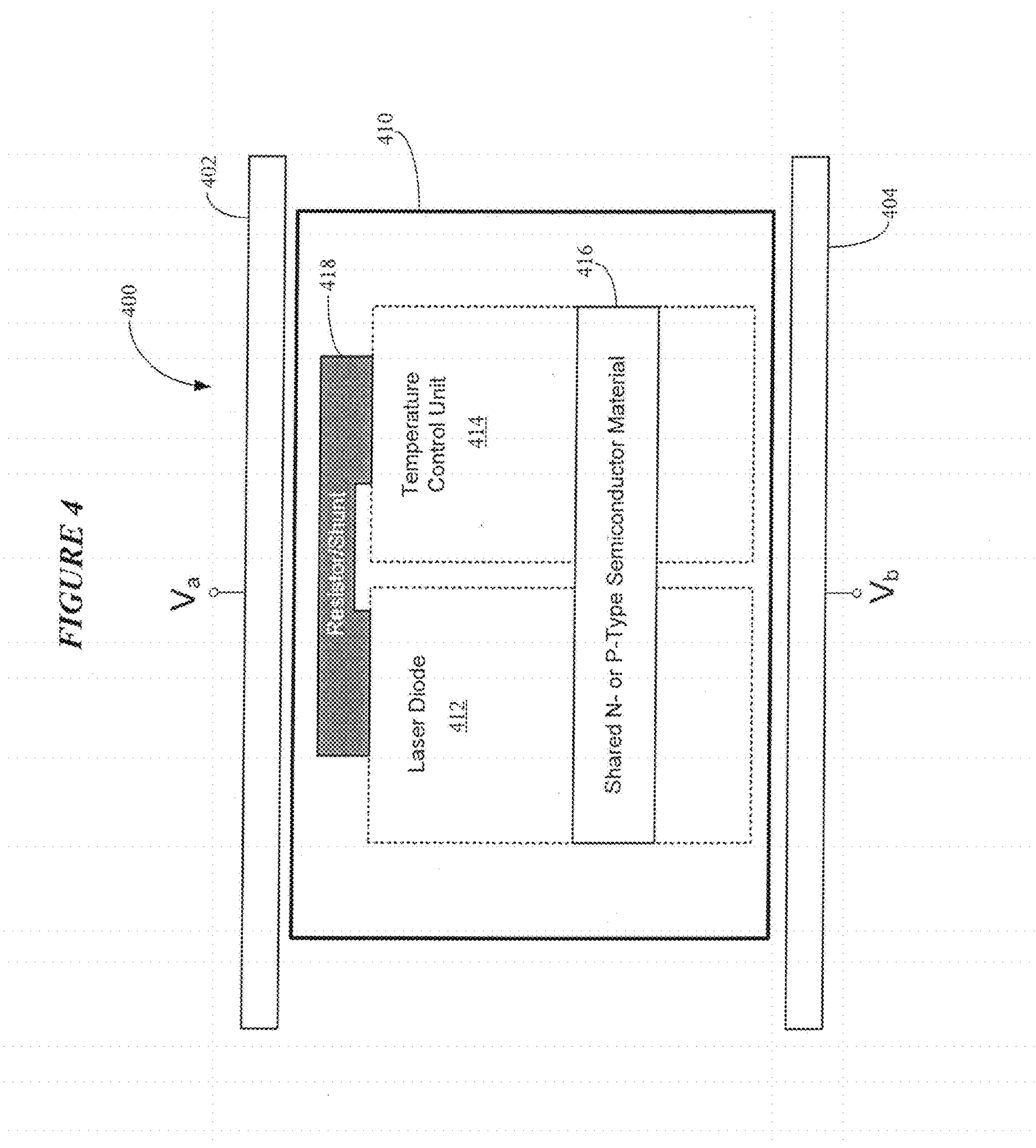
FIG. 4 shows an integrated semiconductor device which incorporates a laser diode and a temperature control unit (TCU) in accordance with various embodiments.

FIG. 4 shows an integrated semiconductor device 400 which incorporates a laser diode 412 and a temperature control unit 414 in accordance with various embodiments. The integrated semiconductor device 400 includes a first electrical contact 402, a second electrical contact 404, and a semiconductor device 410 disposed between the first and second electrical contacts 402 and 404. The semiconductor device 410 incorporates the laser diode 412 and TCU 414, both of which comprise n- and p-type semiconductor materials. In some embodiments, the laser diode 414 and TCU 414 are fabricated using an n-type semiconductor substrate. In other embodiments, the laser diode 414 and TCU 414 are fabricated using a p-type semiconductor substrate. It is noted that the semiconductor substrate should be highly doped in order to reduce resistance between the substrate and the electrical shunts. This is particularly important for the TCU-active bias (i.e., when $V_b>V_a$). Depending on the particular construction, the laser diode 412 and the TCU 414 share at least some of the n- or p-type semiconductor material 416. For an integrated semiconductor device 400 formed from an n-type semiconductor substrate, at least one layer of n-type semiconductor material is shared (e.g., contiguous) between the laser diode 412 and the TCU 414. For an integrated semiconductor device 400 formed from a p-type semiconductor substrate, at least one layer of p-type semiconductor material is shared (e.g., contiguous) between the laser diode 412 and the TCU 414.

According to various embodiments, the TCU 414 is constructed to serve as a heater and a temperature sensor for the laser diode 412. As is shown in FIG. 4, and according to some embodiments, the TCU 414 can include a heating resistor 418 that generates heat when current flows through the resistor 418. The TCU 414 also includes a P-N junction that generates heat when the TCU 414 is activated. Together, the resistor 418 and junction of the TCU 414 generate heat for preheating the laser diode 412 prior to a write operation. In other embodiments, the TCU 414 includes a shunt 418 (e.g., ~0 Ohms) coupled between the TCU 414 and the laser diode 412. In such embodiments, the P-N junction of the TCU 414 generates heat for preheating the laser diode 412 prior to a write operation.

In addition, the P-N junction of the TCU 414 can be used to form a diode type thermometer which can sense the temperature of the laser diode 412. During operation, the TCU 414 can sense the temperature of the laser diode 412 and generate sufficient heat to warm the laser diode 412 to a predefined temperature or temperature range, such as one that avoids one or more critical temperatures associated with mode hopping.

The laser diode 412 and TCU 414 are coupled to the first and second electrical contacts 402 and 404 in parallel. The laser diode 412 is configured to activate and the TCU 414 is configured to deactivate in response to application of a first differential voltage (e.g., $V_a>V_b$) to the first and second electrical contacts 402 and 404. The laser diode 412 is configured to deactivate and the TCU 414 is configured to activate in response to application of a second differential voltage (e.g., $V_a<V_b$) opposite in polarity to the first differential voltage to the first and second electrical contacts 402 and 404. The resistor 418 (when present) and P-N junction of the TCU 414 are configured to generate heat to warm the laser diode 412 when the TCU 414 is activated and the laser diode 412 is deactivated. The TCU 414 is also configured to sense a temperature of the laser diode 412 when the TCU 414 is activated in the laser diode 412 is deactivated.

Notably, the integrated semiconductor device 400 requires only two electrical contacts 402 and 404 for operation of the laser diode 412 and the TCU 414. As such, only two electrical bond pads of a HAMR slider are required to operate the laser diode 412 and the TCU 414. It can be appreciated that independent laser diode and TCU circuits would require up to four electrical contacts and, therefore, up to four electrical bond pads of a HAMR slider. Although only two electrical bond pads are required to operate the laser diode 412 and the TCU 414 shown in FIG. 4 (and other figures), it is understood that, in some embodiments, the electrical contacts of the laser diode 412 and the TCU 414 can be configured to facilitate connection to different pairs of bond pads. For example, the laser diode 412 can include first and second electrical contacts that can be connected to a first pair of bond pads. The TCU 414 can include first and second electrical contacts that can be connected to a second pair of bond pads, allowing for independent control of the laser diode 412 and TCU 414.

Figure 5:
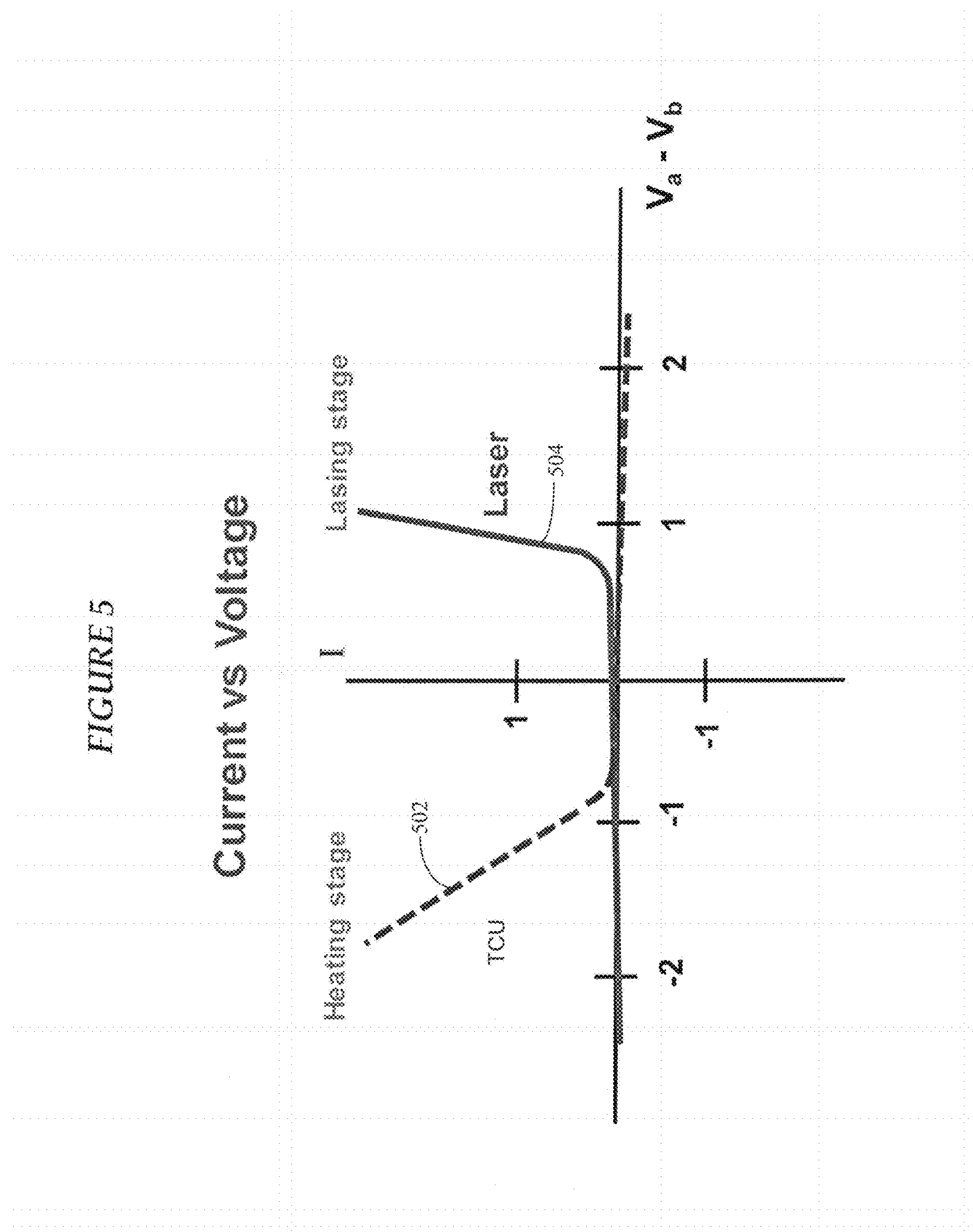
FIG. 5 is a graph of current versus voltage for the laser diode and TCU shown in FIG. 4 and other figures.

FIG. 5 is a graph of current versus voltage for the laser diode 412 and TCU 414 shown in FIG. 4 (and other figures). The graph of FIG. 5 assumes that the P-N junctions of the laser diode 414 and TCU 414 have a barrier (built-in) potential of ~0.7 V. It is noted that the barrier (built-in) potential for GaAs-based diodes should be about 1.4 V. When the differential voltage across the first and second electrical contacts 402 and 404 is negative (e.g., $V_b>V_a$), the laser diode 412 is reversed biased (deactivated) and the TCU 414 is forward biased (activated). Curve 502 shows the TCU 414 during a heating stage when $V_b>V_a$, which results in preheating of the laser diode 412 during a non-lasing stage. When the differential voltage across the first and second electrical contacts 402 and 404 is positive (e.g., $V_a>V_b$), the laser diode 412 is forward biased (activated) and the TCU 414 is reversed biased (deactivated). Curve 504 shows the laser diode 412 during a lasing stage when $V_a > V_b$, which occurs during a write operation.

Figure 6:
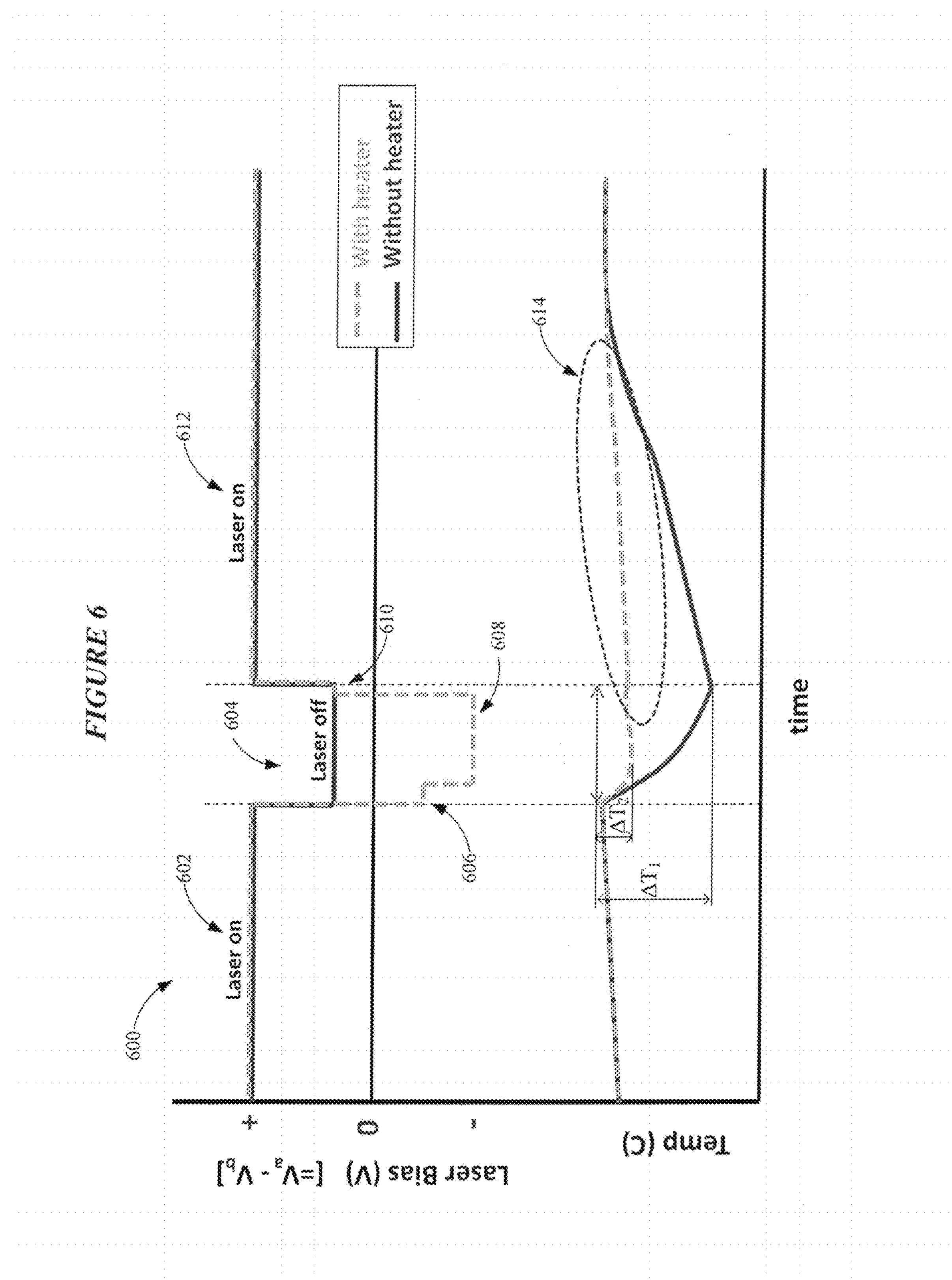
FIG. 6 is a graph of laser diode bias and laser junction temperature which characterize the operation of the integrated semiconductor device shown in FIG. 4 and other figures.

FIG. 6 is a graph 600 of laser diode bias, $V=[V_a-V_b]$, and laser junction temperature, which characterize the operation of the integrated semiconductor device 400 shown in FIG. 4 (and other figures). The solid curve labeled "without heater" characterizes the laser diode 412 without contribution from the integrated TCU 414. The dashed curve labeled "with heater" characterizes the laser diode 412 with contribution from the integrated TCU 414. As illustrated in FIG. 6, both arrangements (laser diode+TCU, and laser diode without TCU) operate with the same laser bias voltage and junction temperature during a first laser ON period 602. During the ON period 602, the laser diode 412 is forward biased (active) and the TCU 414 is reversed biased (deactivated). However, during a laser OFF period 604, the TCU 414 is forward biased (e.g., provided with negative bias from the laser diode perspective) and the laser diode 412 is reversed biased. During the initial time period of the laser OFF period 604, the TCU 414 operates in a thermometer mode 606 to measure the laser diode junction temperature in addition to providing heating to the laser diode 412. Thus, the TCU 414 serves as a temperature sensor for the laser diode junction at least during a portion of the non-lasing state. In some cases, sensing can be accomplished during a lower laser bias level than during a heater mode 608, as illustrated in FIG. 6. One or both of the thermometer mode 606 and the heater mode 608 may involve application of preheating to the laser diode junction during the laser OFF period 604. When lasing is desired (e.g., for a write operation), the laser bias is driven in an opposing direction such that the laser diode 412 is ready for lasing as illustrated at state 610. Application of a higher forward bias voltage to the laser diode 412 causes the laser to lase in a laser ON mode 612, during which the TCU 414 is reversed bias and inactive.

FIG. 6 additionally illustrates the difference between junction temperatures of the laser diode 412 without heating and with heating by the TCU 414. As illustrated in FIG. 6, region 614 of the laser diode 412 experiences a much smaller temperature fluctuation at the junction than the laser diode 412 with no heating by the TCU 414. Thus, $\Delta T_2 < \Delta T_1$. It can be seen in FIG. 6 that the temperature differential $\Delta T_2$ of the junction for the laser diode 412 between the lasing state and the non-lasing state is much smaller than the temperature differential $\Delta T_1$ of the junction for the laser diode without heating by the TCU 414 between the lasing state and the non-lasing state.

FIG. 7 is a flow chart that characterizes the general operation of the integrated semiconductor device 400 shown in FIG. 4 (and other figures) in accordance with various embodiments. The method shown in FIG. 7 involves selectively applying 702 differential voltages to first and second electrical contacts of an integrated laser diode/temperature control unit. The method involves activating 704 the temperature control unit and deactivating the laser diode in response to applying a first differential voltage to the first and second electrical contacts. The method involves measuring 706 laser diode temperature and heating 708 the laser diode during activation of the temperature control unit. As was discussed previously, the laser diode junction temperature can be measured during an initial stage of heating by the temperature control unit. The method further involves deactivating 710 the temperature control unit and activating the laser diode in response to applying a second differential voltage opposite in polarity to the first differential voltage to the first and second electrical contacts. The method may further involve writing 712 to HAMR media during activation of the laser diode. The processes shown in FIG. 7 can be repeated for subsequent write operations.

Figure 8:
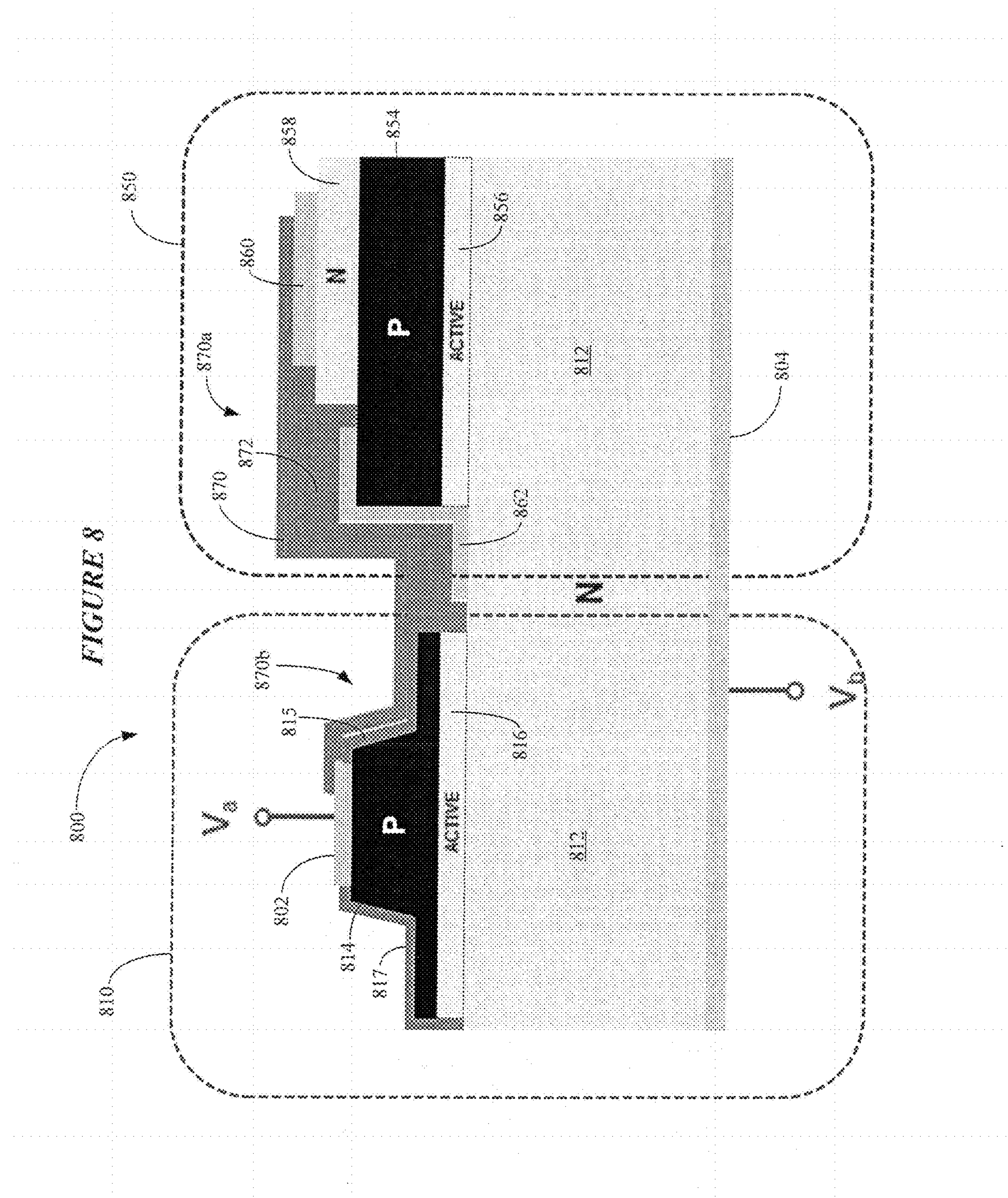
FIG. 8 illustrates an integrated semiconductor device which includes a laser diode and an integral temperature control unit in accordance with various embodiments.

FIG. 8 illustrates an integrated semiconductor device 800 which includes a laser diode 810 and an integral temperature control unit 850 in accordance with various embodiments. The integrated semiconductor device 800 shown in FIG. 8 is a device formed on an n-type semiconductor substrate 812. Notably, the integrated semiconductor device 800 requires only two electrical contacts 802 and 804 for operation of the laser diode 810 and the TCU 850. As such, only two electrical bond pads of a HAMR slider are required to operate the laser diode 810 and the TCU 850. It can be appreciated that independent laser diode and TCU circuits would require up to four electrical contacts and, therefore, up to four electrical bond pads of a HAMR slider. Although only two electrical bond pads are required to operate the laser diode 810 and the TCU 850 shown in FIG. 8 (and other figures), it is understood that, in some embodiments, the electrical contacts of the laser diode 810 and the TCU 850 can be configured to facilitate connection to different pairs of bond pads. For example, the laser diode 810 can be connected to a first pair of bond pads, and the TCU 850 can be connected to a second pair of bond pads, allowing for independent control of the laser diode 810 and TCU 850.

The laser diode 810 comprises first p-type semiconductor material 814 in contact with the first electrical contact 802. The laser diode 810 includes shared n-type semiconductor material in contact with the second electrical contact 804. An active region 816 is defined between the first p-type semiconductor material 814 and the shared n-type semiconductor material 812 at a P-N junction of the laser diode 810. The TCU 850 includes second p-type semiconductor material 854 in contact with second n-type semiconductor material 858, with a first P-N junction defined therebetween. The TCU 850 includes shared n-type semiconductor material 812 in contact with the second electrical contact 804. An active region 856 is defined between the second p-type semiconductor material 854 and the shared n-type semiconductor material 812 at a second P-N junction of the TCU 850. It can be seen in FIG. 8 that the shared n-type semiconductor material 812 represents semiconductor material used by both the laser diode 810 and the TCU 850. The TCU 850 also includes an electrical shunt 862 between the shared n-type semiconductor material 812 and the second p-type semiconductor material 854.

According to some embodiments, a resistor 870 extends from the TCU 850 to the laser diode 810 and serves to heat the laser diode 810 when current flows through the resistor 870. Additional heating of the laser diode 810 is provided by the first P-N junction defined between the second p-type semiconductor material 854 and the second n-type semiconductor material 858. The resistor 870 is coupled to the second n-type semiconductor material 858 via an interconnect 860. The resistor 807 extends over a portion of the first p-type semiconductor material 814 of the laser diode 810 and is electrically coupled to the first electrical contact 802. According to some embodiments, the resistance of the resistor 870 within the TCU 850 (see region 870*a*) can be relatively low (e.g., <25% of the total resistance). The resistor 870 in the region 870*a* can be made relatively thick and/or wide in order to reduce the resistance of this portion of the resistor 870. The resistance of the resistor 870 within the laser diode 810 (see region 870*b*) can be relatively high (e.g., >75% of the total resistance). The resistor 870 in the region 870*b* can be made relatively thin and/or narrow in order to increase the resistance of this portion of the resistor 870. As was discussed previously, a shunt 870 (rather than a resistor) can extend from the TCU 850 to the laser diode 810, in which case the P-N junction of the TCU 850 serves to heat the laser diode 810.

An electrical insulator 872 is disposed between the resistor 870 within the TCU 850 (portion 870*a*) and other elements of the TCU 850. The electrical insulator 872 can have relatively low (e.g., <2 W/m-K) thermal conductivity and be made relatively thick. Suitable materials for forming the electrical insulator 870 include alumina, silica, and silicon nitride. An electrical insulator 815 is disposed between the resistor/shunt 870 within the TCU 850 (portion 870*b*) and other elements of the laser diode 810. The electrical insulator 815 can have relatively high (>20 W/m-K) thermal conductivity and be made relatively thin. Suitable materials for forming the electrical insulator 815 include AlN, BeO, MgO, sapphire, and diamond. An electrical insulator 817 extends between the first electrical contact 802 and a side of the active region 816 covering a portion of the first p-type semiconductor material 814.

Operation of the integrated semiconductor device 800 shown in FIG. 8 will now be described. When $V_a > V_b$ by at least the barrier (built-in) potential of the P-N junction of the laser diode 810, the laser diode 810 is activated and the TCU 850 is deactivated. Current flows from the first electrical contact 802, through the active region at the P-N junction formed between the first p-type semiconductor material 814 and the shared n-type semiconductor material 812, and to the second electrical contact 804. When biased in this manner, the laser diode 810 is emitting. Current flow through the TCU 850 is prevented due to reverse biasing of the first P-N junction formed between the second p-type semiconductor material 854 and the second n-type semiconductor material 858.

When $V_b > V_a$ by at least the barrier (built-in) potential of the first P-N junction 854/858 of the TCU 850, the TCU 850 is activated and the laser diode 810 is deactivated due to reverse biasing of the P-N junction of the laser diode 810. Current flows through the TCU 850, through the resistor/shunt 870, and to the first electrical contact 802. More particularly, current passes from the second electrical contact 804 to the first electrical contact 802 and through a path which includes the shared n-type semiconductor material 812, the electrical shunt 862, the first P-N junction formed between the second p-type semiconductor material 854 and the second n-type semiconductor material 858, the electrical interconnect 860, and the resistor/shunt 870. Current passing through the resistor 870 (when present) and heat generated at the first P-N junction 854/858 of the TCU 850 serves to heat the laser diode 810 during its non-lasing state.

Figure 9:
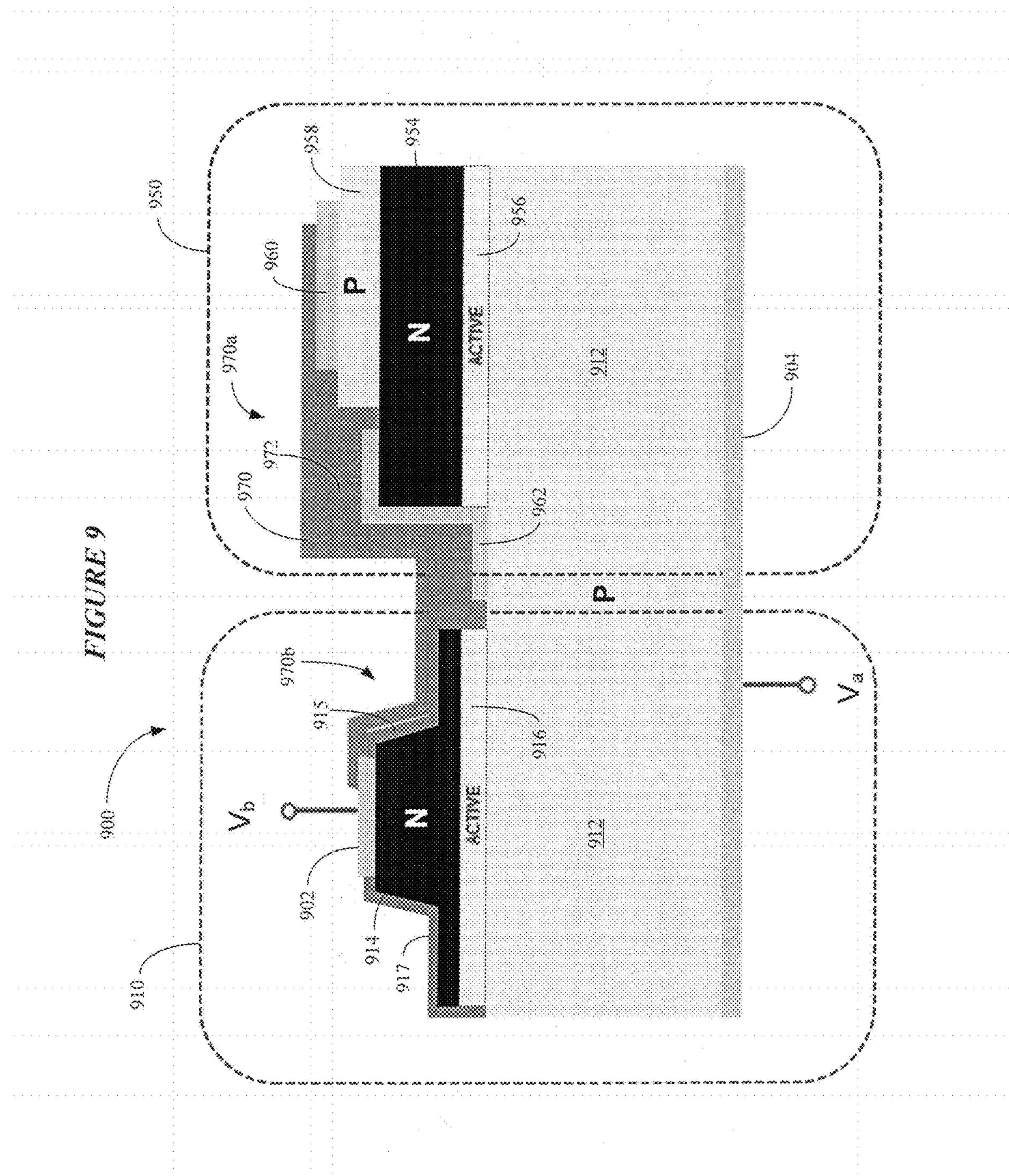
FIG. 9 illustrates an integrated semiconductor device which includes a laser diode and an integral temperature control unit in accordance with various embodiments.

FIG. 9 illustrates an integrated semiconductor device 900 which includes a laser diode 910 and an integral temperature control unit 950 in accordance with various embodiments. The integrated semiconductor device 900 shown in FIG. 9 is a device formed on a p-type semiconductor substrate 912. The integrated semiconductor device 900 requires only two electrical contacts 902 and 904 for operation of the laser diode 910 and the TCU 950, thus requiring only two electrical bond pads of a HAMR slider. Although only two electrical bond pads are required to operate the laser diode 910 and the TCU 950 shown in FIG. 9, it is understood that, in some embodiments, the electrical contacts of the laser diode 910 and the TCU 950 can be configured to facilitate connection to different pairs of bond pads. For example, the laser diode 910 can be connected to a first pair of bond pads, and the TCU 950 can be connected to a second pair of bond pads, allowing for independent control of the laser diode 910 and TCU 950.

The laser diode 910 comprises first n-type semiconductor material 914 in contact with the first electrical contact 902. The laser diode 910 includes shared p-type semiconductor material in contact with the second electrical contact 904. An active region 916 is defined between the first n-type semiconductor material 914 and the shared p-type semiconductor material 912 at a P-N junction of the laser diode 910. The TCU 950 includes second n-type semiconductor material 954 in contact with second p-type semiconductor material 958, with a first P-N junction defined therebetween. The TCU 950 includes shared p-type semiconductor material 912 in contact with the second electrical contact 904. An active region 956 is defined between the second n-type semiconductor material 954 and the shared p-type semiconductor material 912 at a second P-N junction of the TCU 950. It can be seen in FIG. 9 that the shared p-type semiconductor material 912 represents semiconductor material used by both the laser diode 910 and the TCU 950. The TCU 950 also includes an electrical shunt 962 between the shared p-type semiconductor material 912 and the second n-type semiconductor material 954.

According to some embodiments, a resistor 970 extends from the TCU 950 to the laser diode 910 and serves to heat the laser diode 910 when current flows through the resistor 970. Additional heating of the laser diode 910 is provided by the first P-N junction defined between the second n-type semiconductor material 954 and the second p-type semiconductor material 958. The resistor 970 is coupled to the second p-type semiconductor material 958 via an interconnect 960. The resistor 970 extends over a portion of the first n-type semiconductor material 914 of the laser diode 910 and is electrically coupled to the first electrical contact 902. In some embodiments, and as previously discussed, the resistance of the resistor 970 can be relatively low in the region 970*a* and relatively high in the region 970*b*. The electrical insulators 972, 915, and 917 can have properties the same as or similar to the electrical insulators 872, 815, and 817 shown in FIG. 8. Operation of the integrated semiconductor device 900 shown in FIG. 9 is equivalent to that of the device 800 shown in FIG. 8 depending on the polarity of the voltage differential $V_a - V_b$. As was discussed previously, a shunt 970 (rather than a resistor) can extend from the TCU 950 to the laser diode 910, in which case the P-N junction of the TCU 950 serves to heat the laser diode 910.

Figure 10:
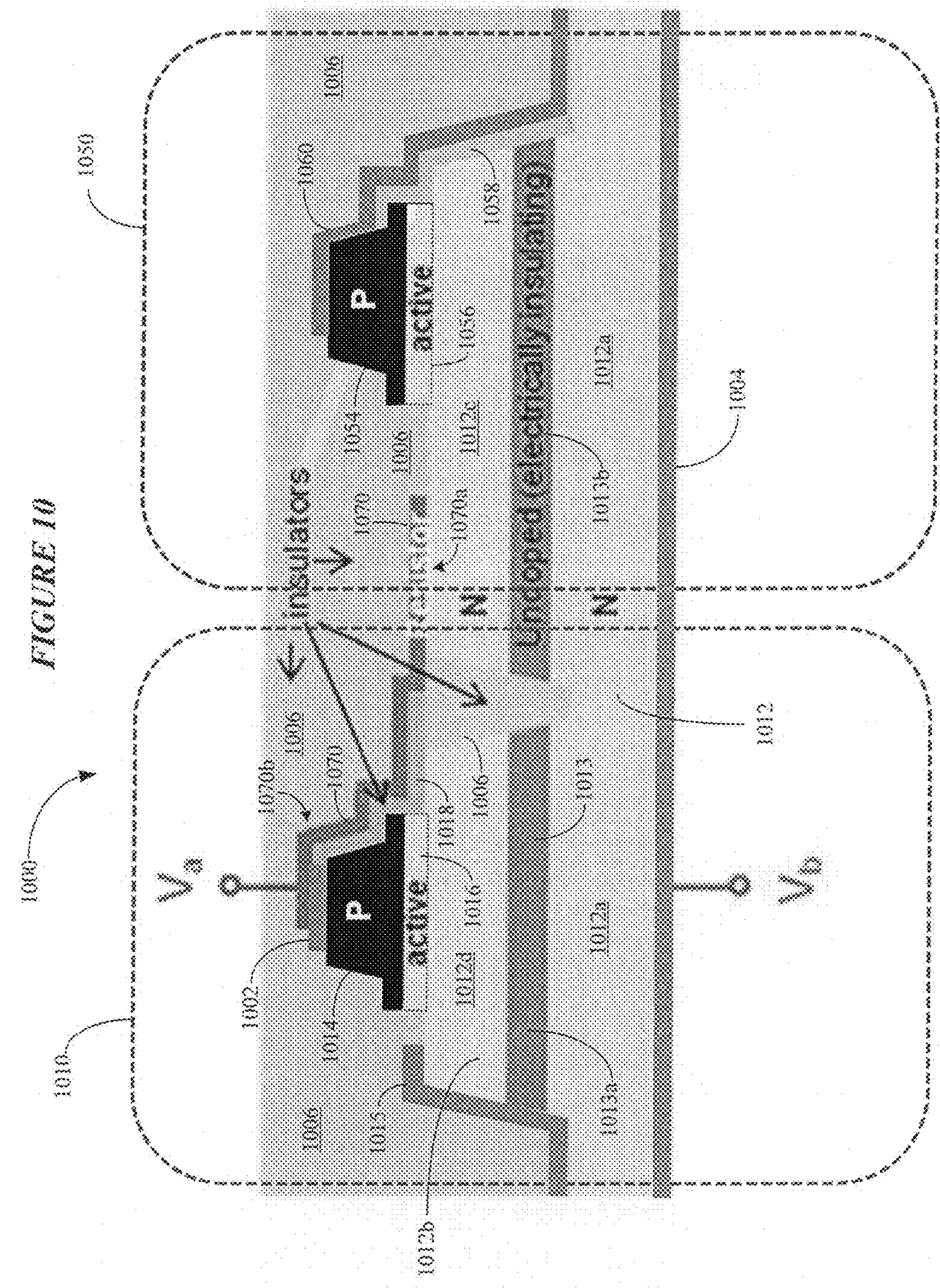
FIG. 10 illustrates an integrated semiconductor device which includes a laser diode and an integral temperature control unit in accordance with various embodiments.

FIG. 10 illustrates an integrated semiconductor device 1000 which includes a laser diode 1010 and an integral temperature control unit 1050 in accordance with various embodiments. The integrated semiconductor device 1000 requires only two electrical contacts 1002 and 1004 for operation of the laser diode 1010 and TCU 1050, thus requiring only two electrical bond pads of the HAMR slider. Although only two electrical bond pads are required to operate the laser diode 1010 and the TCU 1050 shown in FIG. 10, it is understood that, in some embodiments, the electrical contacts of the laser diode 1010 and the TCU 1050 can be configured to facilitate connection to different pairs of bond pads. For example, the laser diode 1010 can be connected to a first pair of bond pads, and the TCU 1050 can be connected to a second pair of bond pads, allowing for independent control of the laser diode 1010 and TCU 1050.

The integrated semiconductor device 1000 shown in FIG. 10 is a device formed on an n-type semiconductor substrate 1012. The n-type semiconductor substrate 1012 includes a first region 1012*a*, a second region 1012*b*, and an undoped, electrically insulating region 1013 between the first and second regions 1012*a* and 1012*b*. The electrically insulating region 1013 includes a first insulating region 1013*a* of the laser diode 1010, a second insulating region 1013*b* of the TCU 1050, and an insulator 1006 disposed between the first and second insulating layers 1013*a* and 1013*b*.

The first region 1012*a* is referred to as shared n-type semiconductor material because the first region 1012*a* is shared by both the laser diode 1010 and the TCU 1050. The second region 1012*b* includes first n-type semiconductor material 1012*c* of the TCU 1050 and second n-type semiconductor material 1012*d* of the laser diode 1010. The insulator 1006 is disposed between the first n-type semiconductor material 1012*c* and the second n-type semiconductor material 1012*d*.

The laser diode 1010 comprises first p-type semiconductor material 1014 in contact with the first electrical contact 1002, and an active region 1016 defined between the first p-type semiconductor material 1014 and the first n-type semiconductor material 1012*d* to define a P-N junction. The laser diode 1010 also comprises the first insulating region 1013*a*, the shared n-type semiconductor material 1012*a*, and a first electrical shunt 1015 between the first n-type semiconductor material 1012*d* and the shared n-type semiconductor material 1012*a*. The first electrical shunt 1015 bridges the electrically insulating layer 1013*a*, thereby electrically connecting the first n-type semiconductor material 1012*d* and the shared n-type semiconductor material 1012*a*.

The TCU 1050 comprises second p-type semiconductor material 1054, second n-type semiconductor material 1012*c*, and an active region 1056 between the second p-type semiconductor material 1054 and the second n-type semiconductor material 1012*c* to define a P-N junction. The TCU 1050 also includes the electrically insulating layer 1013*b*, the shared n-type semiconductor material 1012*a*, and a second electrical shunt 1060 between the shared n-type semiconductor material 1012*a* and the second p-type semiconductor material 1054. An insulator 1058 is disposed between the second electrical shunt 1060 and the active region 1056, second n-type semiconductor material 1012*c*, and electrically insulating layer 1013*b*. The second electrical shunt 1060 provides an electrically conductive bridge between the second p-type semiconductor material 1054 and the shared n-type semiconductor material 1012*a*.

According to some embodiments, a resistor 1070 extends from the TCU 1050 to the laser diode 1010 and serves to heat the laser diode 1010 when current flows through the resistor 1070. Additional heating of the laser diode 1010 is provided by the P-N junction of the TCU 1050. The resistor 1070 is coupled to the second n-type semiconductor material 1012*c*, such as by an electrical interconnect (not shown). The resistor 1070 extends over a portion of the first p-type semiconductor material 1014 (and a portion of the first n-type semiconductor material 1012*d*) of the laser diode 1010 and is electrically coupled to the first electrical contact 1002. In some embodiments, and as previously discussed, the resistance of the resistor 1070 can be relatively low in the region 1070*a* disposed within the TCU 1050 and relatively high in the region 1070*b* disposed within the laser diode 1010. As was discussed previously, a shunt 1070 can extend from the TCU 1050 to the laser diode 1010, in which case the P-N junction of the TCU 1050 serves to heat the laser diode 1010.

An electrical insulator 1018 is disposed between the resistor/shunt 1070 and elements of the laser diode 1010. The electrical insulator 1018 can have relatively high (>20 W/m-K) thermal conductivity and be made relatively thin. Suitable materials for forming the electrical insulator 815 include AlN, BeO, MgO, sapphire, and diamond. An electrical insulator 1006 shown in the laser diode 1010 and the TCU 1050 can have relatively low (e.g., <2 W/m-K) thermal conductivity and be made relatively thick. Suitable materials for forming the electrical insulator 1006 include alumina, silica, and silicon nitride.

Operation of the integrated semiconductor device 1000 shown in FIG. 10 will now be described. When $V_a > V_b$ by at least the barrier (built-in) potential of the P-N junction of the laser diode 1010, the laser diode 1010 is activated and the TCU 1050 is deactivated. Current flows from the first electrical contact 1002, through the P-N of the TCU 1050, across the electrical shunt 1015, through the shared n-type semiconductor material 1012*a*, and to the second electrical contact 1004. Current flow through the TCU 1050 is prevented due to reverse biasing of the P-N junction formed between the second p-type semiconductor material 1054 and the second n-type semiconductor material 1012*c*.

When $V_b > V_a$ by at least the barrier (built-in) potential of the P-N junction of the TCU 1050, the TCU 1050 is activated and the laser diode 1010 is deactivated due to reverse biasing of the P-N junction of the laser diode 1010. Current flows through the TCU 1050, through the resistor/shunt 1070, and to the first electrical contact 1002. More particularly, current passes from the second electrical contact 1004 to the first electrical contact 1002 through a path which includes the shared n-type semiconductor material 1012*a*, the second electrical shunt 1060, the P-N junction of the TCU 1050, and the resistor/shunt 1070. Current passing through the resistor 1070 (when present) and heat generated at the P-N junction of the TCU 1050 serves to heat the laser diode 810 during its non-lasing state.

Figure 11:
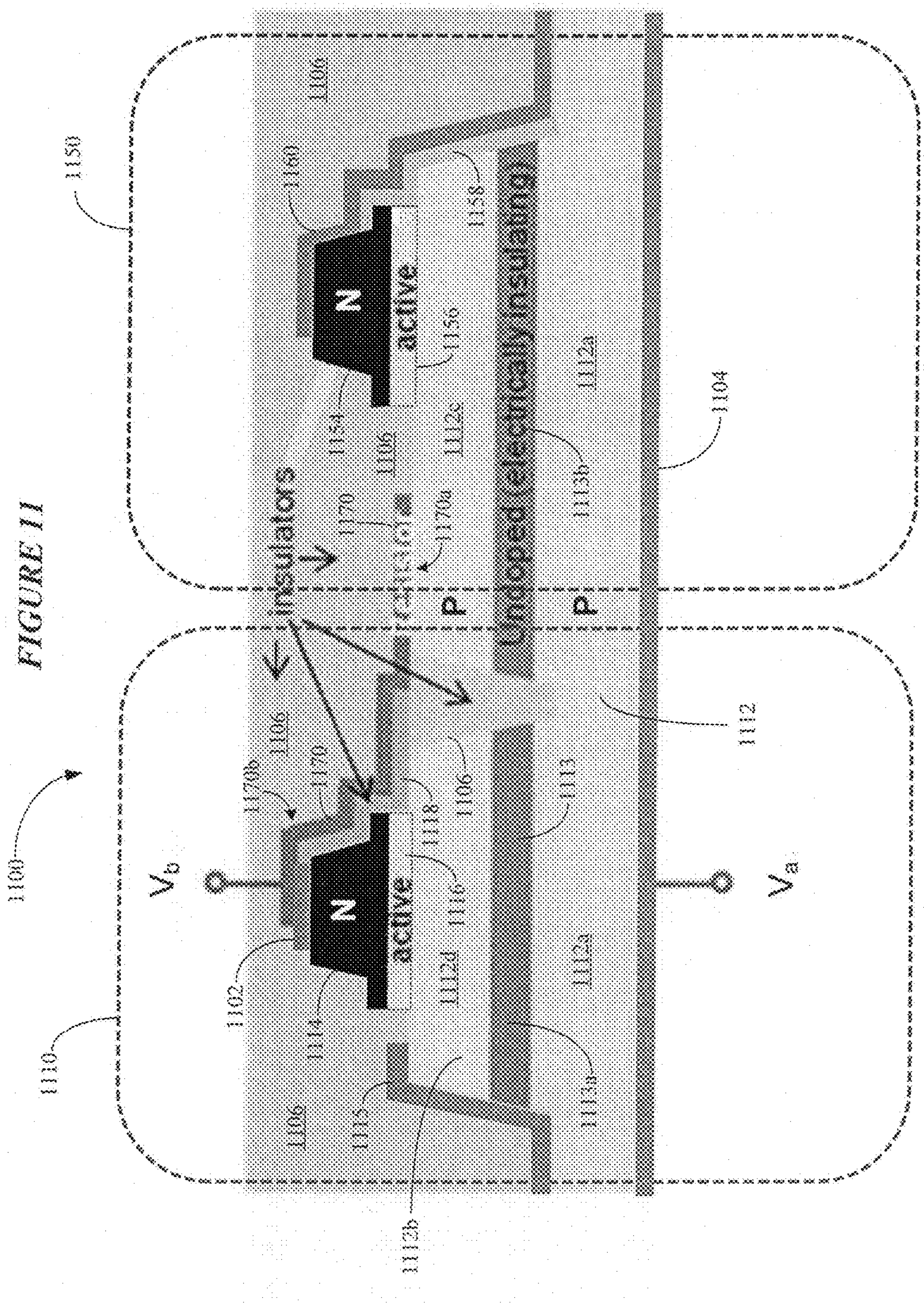
FIG. 11 illustrates an integrated semiconductor device which includes a laser diode and an integral temperature control unit in accordance with various embodiments.

FIG. 11 illustrates an integrated semiconductor device 1100 which includes a laser diode 1110 and an integral temperature control unit 1150 in accordance with various embodiments. The integrated semiconductor device 1100 requires only two electrical contacts 1102 and 1104 for operation of the laser diode 1110 and TCU 1150, thus requiring only two electrical bond pads of the HAMR slider. Although only two electrical bond pads are required to operate the laser diode 1110 and the TCU 1150 shown in FIG. 11, it is understood that, in some embodiments, the electrical contacts of the laser diode 1110 and the TCU 1150 can be configured to facilitate connection to different pairs of bond pads. For example, the laser diode 1110 can be connected to a first pair of bond pads, and the TCU 1150 can be connected to a second pair of bond pads, allowing for independent control of the laser diode 1110 and TCU 1150.

The integrated semiconductor device 1100 shown in FIG. 11 is a device formed on a p-type semiconductor substrate 1112. The p-type semiconductor substrate 1112 includes a first region 1112*a*, a second region 1112*b*, and an undoped, electrically insulating region 1113 between the first and second regions 1112*a* and 1112*b*. The electrically insulating region 1113 includes a first insulating region 1113*a* of the laser diode 1110, a second insulating region 1113*b* of the TCU 1150, and an insulator 1106 disposed between the first and second insulating layers 1113*a* and 1113*b*.

The first region 1112*a* is referred to as shared p-type semiconductor material because the first region 1112*a* is shared by both the laser diode 1110 and the TCU 1150. The second region 1112*b* includes first p-type semiconductor material 1112*c* of the TCU 1050 and second p-type semiconductor material 1112*d* of the laser diode 1110. The insulator 1106 is disposed between the first p-type semiconductor material 1112*c* and the second p-type semiconductor material 1112*d*.

The laser diode 1110 comprises first n-type semiconductor material 1114 in contact with the first electrical contact 1102, and an active region 1116 defined between the first n-type semiconductor material 1114 and the first p-type semiconductor material 1112*d* to define an P-N junction. The laser diode 1110 also comprises the first insulating region 1113*a*, the shared p-type semiconductor material 1112*a*, and a first electrical shunt 1115 between the first p-type semiconductor material 1112*d* and the shared p-type semiconductor material 1112*a*. The first electrical shunt 1115 bridges the electrically insulating layer 1113*a*, thereby electrically connecting the first p-type semiconductor material 1112*d* and the shared p-type semiconductor material 1112*a*.

The TCU 1150 comprises second n-type semiconductor material 1154, second p-type semiconductor material 1112*c*, and an active region 1156 between the second n-type semiconductor material 1154 and the second p-type semiconductor material 1112*c* to define a P-N junction. The TCU 1150 also includes the electrically insulating layer 1113*b*, the shared p-type semiconductor material 1112*a*, and a second electrical shunt 1160 between the shared p-type semiconductor material 1112*a* and the second n-type semiconductor material 1154. An insulator 1158 is disposed between the second electrical shunt 1160 and the active region 1156, second p-type semiconductor material 1112*c*, and electrically insulating layer 1113*b*. The second electrical shunt 1160 provides an electrically conductive bridge between the second n-type semiconductor material 1154 and the shared p-type semiconductor material 1112*a*.

According to some embodiments, a resistor 1170 extends from the TCU 1150 to the laser diode 1110 and serves to heat the laser diode 1110 when current flows through the resistor 1170. Additional heating of the laser diode 1110 is provided by the P-N junction of the TCU 1150. The resistor 1170 is coupled to the second p-type semiconductor material 1112*c*, such as by an electrical interconnect (not shown). The resistor 1170 extends over a portion of the first n-type semiconductor material 1114 (and a portion of the first p-type semiconductor material 1112*d*) of the laser diode 1110 and is electrically coupled to the first electrical contact 1102. In some embodiments, and as previously discussed, the resistance of the resistor 1170 can be relatively low in the region 1170*a* disposed within the TCU 1150 and relatively high in the region 1170*b* disposed within the laser diode 1110. As was discussed previously, a shunt 1170 can extend from the TCU 1150 to the laser diode 1100, in which case the P-N junction of the TCU 1150 serves to heat the laser diode 1110.

An electrical insulator 1118 is disposed between the resistor/shunt 1170 and elements of the laser diode 1110. The electrical insulator 1118 can have relatively high (>20 W/m-K) thermal conductivity and be made relatively thin. Suitable materials for forming the electrical insulator 1118 include AlN, BeO, MgO, sapphire, and diamond. An electrical insulator 1106 shown in the laser diode 1110 and the TCU 1150 can have relatively low (e.g., <2 W/m-K) thermal conductivity and be made relatively thick. Suitable materials for forming the electrical insulator 1106 include alumina and silica. Operation of the integrated semiconductor device 1100 shown in FIG. 11 is equivalent to that of the device 1000 shown in FIG. 10 depending on the polarity of the voltage differential $V_a - V_b$.

In the embodiments discussed above, the n- and p-type semiconductor material can comprise several atomic layers of epitaxially grown semiconductor materials, including Ga, As, GaAs, AlGaAs, InAlGaAs, GaP, InP, GaN, and combinations thereof with varying elemental compositions. The n-type semiconductor may be doped with Ge, S, Se, Si, Sn, Te or other elements that form electrical donors in the material. The p-type semiconductor may be doped with Be, Cr, Ge, Mg, S, Zn or other elements that form electrical acceptors in the material. The electrical shunts can be formed from Al, Cu, Au, or alloys thereof. It is noted that, prior to shunt deposition, adhesion-promoting layers, e.g. Ti, Ta, or W, can be applied.

Systems, devices or methods disclosed herein may include one or more of the features structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality. Various modifications and additions can be made to the disclosed embodiments discussed above. Accordingly, the scope of the present disclosure should not be limited by the particular embodiments described above, but should be defined only by the claims set forth below and equivalents thereof.

What is claimed is:

1. An apparatus, comprising:
- a first electrical contact;
- a second electrical contact; and
- a semiconductor device disposed between the first and second electrical contacts, the semiconductor device comprising:
  - a laser diode comprising p-type semiconductor material and n-type semiconductor material; and
  - a temperature control unit comprising p-type semiconductor material, n-type semiconductor material, and a resistor or a shunt coupled to the laser diode;
- wherein one of the p-type semiconductor material and the n-type semiconductor material is shared by the laser diode and the temperature control unit.

2. The apparatus of claim 1, wherein the n-type semiconductor material is shared by the laser diode and the temperature control unit.

3. The apparatus of claim 1, wherein the p-type semiconductor material is shared by the laser diode and the temperature control unit.

4. The apparatus of claim 1, wherein:
- the laser diode is configured to activate and the temperature control unit is configured to deactivate in response to application of a first differential voltage to the first and second electrical contacts; and
- the laser diode is configured to deactivate and the temperature control unit is configured to activate in response to application of a second differential voltage opposite in polarity to the first differential voltage to the first and second electrical contacts.

5. The apparatus of claim 1, wherein the resistor is configured to generate heat to warm the laser diode when the temperature control unit is activated and the laser diode is deactivated.

6. The apparatus of claim 1, wherein the temperature control unit is configured to sense a temperature of the laser diode when the temperature control unit is activated and the laser diode is deactivated.

7. The apparatus of claim 1, wherein:
- the laser diode comprises:
  - first p-type semiconductor material in contact with the first electrical contact;
  - shared n-type semiconductor material in contact with the second electrical contact; and an active region between the first p-type semiconductor material and the shared n-type semiconductor material; and the temperature control unit comprises:

second p-type semiconductor material in contact with second n-type semiconductor material;

the shared n-type semiconductor material in contact with the second electrical contact;

an active region between the second p-type semiconductor material and the shared n-type semiconductor material; and an electrical shunt between the shared n-type semiconductor material and the second p-type semiconductor material.

8. The apparatus of claim 1, wherein:

the laser diode comprises:

first n-type semiconductor material in contact with the first electrical contact;

shared p-type semiconductor material in contact with the second electrical contact; and an active region between the first n-type semiconductor material and the shared p-type semiconductor material; and the temperature control unit comprises:

second n-type semiconductor material in contact with second p-type semiconductor material;

the shared p-type semiconductor material in contact with the second electrical contact;

an active region between the second n-type semiconductor material and the shared p-type semiconductor material; and an electrical shunt between the shared p-type semiconductor material and the second n-type semiconductor material.

9. The apparatus of claim 1, wherein:

the laser diode comprises:

first p-type semiconductor material in contact with the first electrical contact;

first n-type semiconductor material;

an active region between the first p-type semiconductor material and the first n-type semiconductor material;

shared n-type semiconductor material in contact with the second electrical contact;

an electrically insulating layer between the first n-type semiconductor material and the shared n-type semiconductor material; and a first electrical shunt between the first n-type semiconductor material and the shared n-type semiconductor material; and the temperature control unit comprises:

second p-type semiconductor material;

second n-type semiconductor material;

an active region between the second p-type semiconductor material and the second n-type semiconductor material;

shared n-type semiconductor material in contact with the second electrical contact;

an electrically insulating layer between the second n-type semiconductor material and the shared n-type semiconductor material; and a second electrical shunt between the shared n-type semiconductor material and the second p-type semiconductor material;

wherein an electrical insulator is disposed between the first n-type semiconductor material of the laser diode and the second n-type semiconductor material of the temperature control unit.

10. The apparatus of claim 1, wherein:

the laser diode comprises:

first n-type semiconductor material in contact with the first electrical contact;

first p-type semiconductor material;

an active region between the first n-type semiconductor material and the first p-type semiconductor material;

shared p-type semiconductor material in contact with the second electrical contact;

an electrically insulating layer between the first p-type semiconductor material and the shared p-type semiconductor material; and a first electrical shunt between the first p-type semiconductor material and the shared p-type semiconductor material; and the temperature control unit comprises:

second n-type semiconductor material;

second p-type semiconductor material;

an active region between the second n-type semiconductor material and the second p-type semiconductor material;

shared p-type semiconductor material in contact with the second electrical contact;

an electrically insulating layer between the second p-type semiconductor material and the shared p-type semiconductor material; and a second electrical shunt between the shared p-type semiconductor material and the second n-type semiconductor material;

wherein an electrical insulator is disposed between the first p-type semiconductor material of the laser diode and the second p-type semiconductor material of the temperature control unit.

11. An apparatus, comprising:

a slider configured for heat-assisted magnetic recording, the slider comprising a writer, a near-field transducer, and an optical waveguide configured to communicate light through the slider; and a semiconductor device integral or coupled to the slider, the semiconductor device disposed between a first electrical contact and a second electrical contact and comprising:

a laser diode coupled to the waveguide and comprising p-type semiconductor material and n-type semiconductor material; and a temperature control unit comprising p-type semiconductor material, n-type semiconductor material, and a resistor or a shunt coupled to the laser diode;

wherein one of the p-type and n-type semiconductor materials is shared by the laser diode and the temperature control unit.

12. The apparatus of claim 11, wherein the n-type semiconductor material is shared by the laser diode and the temperature control unit.

13. The apparatus of claim 11, wherein the p-type semiconductor material is shared by the laser diode and the temperature control unit.

14. The apparatus of claim 11, wherein:

the laser diode is configured to activate and the temperature control unit is configured to deactivate in response to application of a first differential voltage to the first and second electrical contacts; and the laser diode is configured to deactivate and the temperature control unit is configured to activate in response to application of a second differential voltage opposite in polarity to the first differential voltage to the first and second electrical contacts.

15. The apparatus of claim 11, wherein the resistor is configured to generate heat to warm the laser diode when the temperature control unit is activated and the laser diode is deactivated.

16. The apparatus of claim 11, wherein the temperature control unit is configured to sense a temperature of the laser diode when the temperature control unit is activated and the laser diode is deactivated.

17. The apparatus of claim 11, wherein:

the laser diode comprises:

first p-type semiconductor material in contact with the first electrical contact;

shared n-type semiconductor material in contact with the second electrical contact; and an active region between the first p-type semiconductor material and the shared n-type semiconductor material; and the temperature control unit comprises:

second p-type semiconductor material in contact with second n-type semiconductor material;

the shared n-type semiconductor material in contact with the second electrical contact;

an active region between the second p-type semiconductor material and the shared n-type semiconductor material; and an electrical shunt between the shared n-type semiconductor material and the second p-type semiconductor material.

18. The apparatus of claim 11, wherein:

the laser diode comprises:

first n-type semiconductor material in contact with the first electrical contact;

shared p-type semiconductor material in contact with the second electrical contact; and an active region between the first n-type semiconductor material and the shared p-type semiconductor material; and the temperature control unit comprises:

second n-type semiconductor material in contact with second p-type semiconductor material;

the shared p-type semiconductor material in contact with the second electrical contact;

an active region between the second n-type semiconductor material and the shared p-type semiconductor material; and an electrical shunt between the shared p-type semiconductor material and the second n-type semiconductor material.

19. The apparatus of claim 11, wherein:

the laser diode comprises:

first p-type semiconductor material in contact with the first electrical contact;

first n-type semiconductor material;

an active region between the first p-type semiconductor material and the first n-type semiconductor material;

shared n-type semiconductor material in contact with the second electrical contact;

an electrically insulating layer between the first n-type semiconductor material and the shared n-type semiconductor material; and a first electrical shunt between the first n-type semiconductor material and the shared n-type semiconductor material; and the temperature control unit comprises:

second p-type semiconductor material;

second n-type semiconductor material;

an active region between the second p-type semiconductor material and the second n-type semiconductor material;

shared n-type semiconductor material in contact with the second electrical contact;

an electrically insulating layer between the second n-type semiconductor material and the shared n-type semiconductor material; and a second electrical shunt between the shared n-type semiconductor material and the second p-type semiconductor material;

wherein an electrical insulator is disposed between the first n-type semiconductor material of the laser diode and the second n-type semiconductor material of the temperature control unit.

20. The apparatus of claim 11, wherein:

the laser diode comprises:

first n-type semiconductor material in contact with the first electrical contact;

first p-type semiconductor material;

an active region between the first n-type semiconductor material and the first p-type semiconductor material;

shared p-type semiconductor material in contact with the second electrical contact;

an electrically insulating layer between the first p-type semiconductor material and the shared p-type semiconductor material; and a first electrical shunt between the first p-type semiconductor material and the shared p-type semiconductor material; and the temperature control unit comprises:

second n-type semiconductor material;

second p-type semiconductor material;

an active region between the second n-type semiconductor material and the second p-type semiconductor material;

shared p-type semiconductor material in contact with the second electrical contact;

an electrically insulating layer between the second p-type semiconductor material and the shared p-type semiconductor material; and a second electrical shunt between the shared p-type semiconductor material and the second n-type semiconductor material;

wherein an electrical insulator is disposed between the first p-type semiconductor material of the laser diode and the second p-type semiconductor material of the temperature control unit.

* * * * *